United States Patent
Hatagami et al.

[11] Patent Number: 6,163,443
[45] Date of Patent: Dec. 19, 2000

[54] ACTUATOR HAVING MR ELEMENT PROTECTING MEANS

[75] Inventors: Toshifumi Hatagami; Takayuki Bitoh, both of Kawasaki, Japan

[73] Assignee: Fujitsu Limited, Kawasaki, Japan

[21] Appl. No.: 09/158,210

[22] Filed: Sep. 22, 1998

[30] Foreign Application Priority Data

Feb. 19, 1998 [JP] Japan .................................. 10-037312

[51] Int. Cl.⁷ ....................................................... G11B 5/40
[52] U.S. Cl. ........................ 360/323; 360/128; 360/245.9; 360/264.2
[58] Field of Search ............................. 360/97.01, 97.02, 360/108, 113, 128, 323, 245.9, 264.2

[56] References Cited

U.S. PATENT DOCUMENTS

| 5,465,186 | 11/1995 | Bajorek et al. . |
| 5,508,611 | 4/1996 | Schroeder et al. . |
| 5,644,454 | 7/1997 | Arya et al. . |
| 5,734,523 | 3/1998 | Scheidecker et al. . |
| 5,963,415 | 10/1999 | Johansen . |
| 5,991,121 | 11/1999 | Kanda . |

FOREIGN PATENT DOCUMENTS

| 4-066287 | 3/1992 | Japan . |
| 7-141636 | 6/1995 | Japan . |
| 8-287498 | 11/1996 | Japan . |
| 8-315321 | 11/1996 | Japan . |

*Primary Examiner*—Craig A. Renner
*Attorney, Agent, or Firm*—Greer, Burns & Crain, Ltd.

[57] ABSTRACT

An actuator assembly including an actuator arm, a suspension fixed to a front end portion of the actuator arm, and a head slider mounted on a front end portion of the suspension and having a magnetoresistive element. The suspension has a pair of first lead lines each of which has one end connected to the magnetoresistive element, and an easily removable short-circuit pattern for connecting the first lead lines with each other. The actuator assembly further includes a main FPC fixed at one end portion thereof to the actuator arm, and an interconnection FPC having a plurality of second lead lines for interconnecting the first lead lines and a wiring pattern of the main FPC. The interconnection FPC further has a plurality of ground lines for electrically connecting the second lead lines to the actuator arm. In using the actuator assembly in a magnetic disk drive, the short-circuit pattern is fused and each ground line is cut.

9 Claims, 8 Drawing Sheets

ACTUATOR HAVING MR ELEMENT PROTECTING MEANS

BACKGROUND OF THE INVENTION

1. Field of the Invention

The present invention relates to an actuator assembly having a magnetoresistive head (MR head), and a magnetic disk drive including the actuator assembly.

2. Description of the Related Art

In response to recent downsizing and density increasing of a magnetic disk drive, the flying height of a head slider has been reduced and it has been desired to realize contact recording/reproduction such that the slider flies at a very short height from a recording medium or comes to contact with the recording medium. In a conventional magnetic induction head, a decrease in peripheral speed (relative speed between the head and the recording medium) due to a decrease in diameter of a magnetic disk causes a deterioration in reproductive output. It has therefore been desired to develop a magnetoresistive head (which will be hereinafter referred to simply as MR head) which can obtain a large reproductive output even at a low peripheral speed with no peripheral speed dependence of reproductive output.

In the MR head, a constant sense current is supplied to a magnetoresistive element (MR element) to convert changes in magnitude of a signal field leaking from a recording track of the recording medium into changes in resistance, thereby reproducing the information recorded on the medium as changes in voltage. The MR element of the MR head or head slider is formed generally by a thin-film process or the like. The head slider further has a coil for writing data to the recording medium. The head slider is mounted by adhesion or the like on a front end portion of a suspension formed of stainless steel.

Lead lines for connecting the MR element and the coil to a recording and reproducing circuit in a magnetic disk drive are formed by copper patterns printed on the suspension. By mounting the suspension on a front end portion of an actuator arm, the MR element and the coil are connected through a flexible printed circuit board (FPC) or the like to the recording and reproducing circuit. In the suspension for supporting a conventional MR head slider, a pair of lead lines connected to the terminals of the MR element are electrically open, or the head lines and a ground line connected to a magnetic shield for the MR element are electrically open. Further, since the electrostatic breakdown voltage between the terminals of the MR head is low, the MR head is limited in handling more than a conventional monolithic head.

Accordingly, when a worker charged with static electricity handles such a suspension having the MR head slider or carries the suspension contained in a static-prone plastic case or the like, an excess current due to the static electricity flows into the MR element to burn the MR element, or the static electricity is discharged between the MR element and the magnetic shield to cause burning of the MR element. In other words, if a voltage of several volts to tens of volts is applied between the terminals of the MR element, between the terminals of the MR element and the head slider, or between the terminals of the coil and the head slider, the MR element may be broken by static electricity, causing a damage to the function of the head.

To cope with this problem various related objects including tools for use in fabrication, head mounting, terminal soldering, etc., working desks, working clothes, and storage shelves are formed of low-static voltage materials. Further, metal portions of the objects are grounded in consideration of safety to avoid charging or electric shock. In addition, an ionizer is used to always remove static electricity from the hand of the worker, for example.

However, the following problems yet remain although the above measures have been taken.

a) The static electricity generated in a human body working with clothes differs according to individuals, and there is a possibility that the static voltage may easily reach a head breakdown voltage.

b) An impedance to the ground cannot be set so low from the safety standpoint against electric shock, so that a margin between an electricity removable potential and a head breakdown voltage is narrow.

Thus, it is very difficult to completely eliminate defective MR heads broken in fabrication, head mounting, terminal soldering, etc.

SUMMARY OF THE INVENTION

It is therefore an object of the present invention to provide an actuator assembly which can prevent burning of an MR element due to static electricity.

In accordance with an aspect of the present invention, there is provided an actuator assembly for a magnetic disk drive, comprising an actuator arm adapted to be rotatably mounted in said magnetic disk drive; a suspension fixed at a base end portion thereof to a front end portion of said actuator arm; a head slider mounted on a front end portion of said suspension and having a magnetoresistive element; a pair of first lead lines formed on said suspension, each of said first lead lines having one end connected to said magnetoresistive element; a short-circuit pattern formed on said suspension to connect said first lead lines with each other; a main flexible printed circuit board fixed at one end portion thereof to said actuator arm and having a read/write circuit; an interconnection flexible printed circuit board mounted on said actuator arm and having a plurality of second lead lines for connecting said first lead lines to said read/write circuit; and a plurality of ground lines formed on said interconnection flexible printed circuit board to electrically connect said second lead lines to said actuator arm.

Preferably, the short-circuit pattern is formed of an easily removable material such as a low-melting point solder and a low-melting point alloy. In using the actuator assembly in the magnetic disk drive, the short-circuit pattern is fused and each ground line is cut.

In accordance with another aspect of the present invention, there is provided a magnetic disk drive comprising a housing; a magnetic disk rotatably mounted in said housing; a head slider having a magnetoresistive element for reading data from said magnetic disk; and an actuator for moving said head slider across tracks of said magnetic disk; said actuator comprising an actuator arm rotatably mounted in said housing; a suspension having a front end portion supporting said head slider and a base end portion fixed to a front end portion of said actuator arm, said suspension including a pair of first lead lines each of which has one end connected to said magnetoresistive element; a main flexible printed circuit board fixed at one end portion thereof to said actuator arm and having a read/write circuit; and an interconnection flexible printed circuit board mounted on said actuator arm and having a plurality of second lead lines for connecting said first lead lines to said read/write circuit; said interconnection flexible printed circuit board having a plurality of ground lines respectively electrically connected to said second lead lines, each of said ground lines being cut in using said actuator in said magnetic disk drive.

In accordance with a further aspect of the present invention, there is provided a fabrication method for an actuator assembly, comprising the steps of providing an actuator arm; fixing one end portion of a main flexible printed circuit board having a read/write circuit and a wiring pattern to said actuator arm; fixing a head assembly to a front end portion of said actuator arm, said head assembly comprising a suspension, a head slider having a magnetoresistive element mounted on a front end portion of said suspension, a pair of first lead lines formed on said suspension, each of said first lead lines having one end connected to said magnetoresistive element, and a short-circuit pattern formed on said suspension to connect said first lead lines with each other; attaching an interconnection flexible printed circuit board to said actuator arm, said interconnection flexible printed circuit board having a plurality of second lead lines for connecting said first lead lines to said read/write circuit, and a plurality of ground lines for respectively electrically connecting said second lead lines to said actuator arm; bonding said wiring pattern of said main flexible printed circuit board and said second lead lines of said interconnection flexible printed circuit board to each other; bonding said first lead lines of said suspension and said second lead lines of said interconnection flexible printed circuit board to each other; fusing said short-circuit pattern; and cutting said plurality of ground lines.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
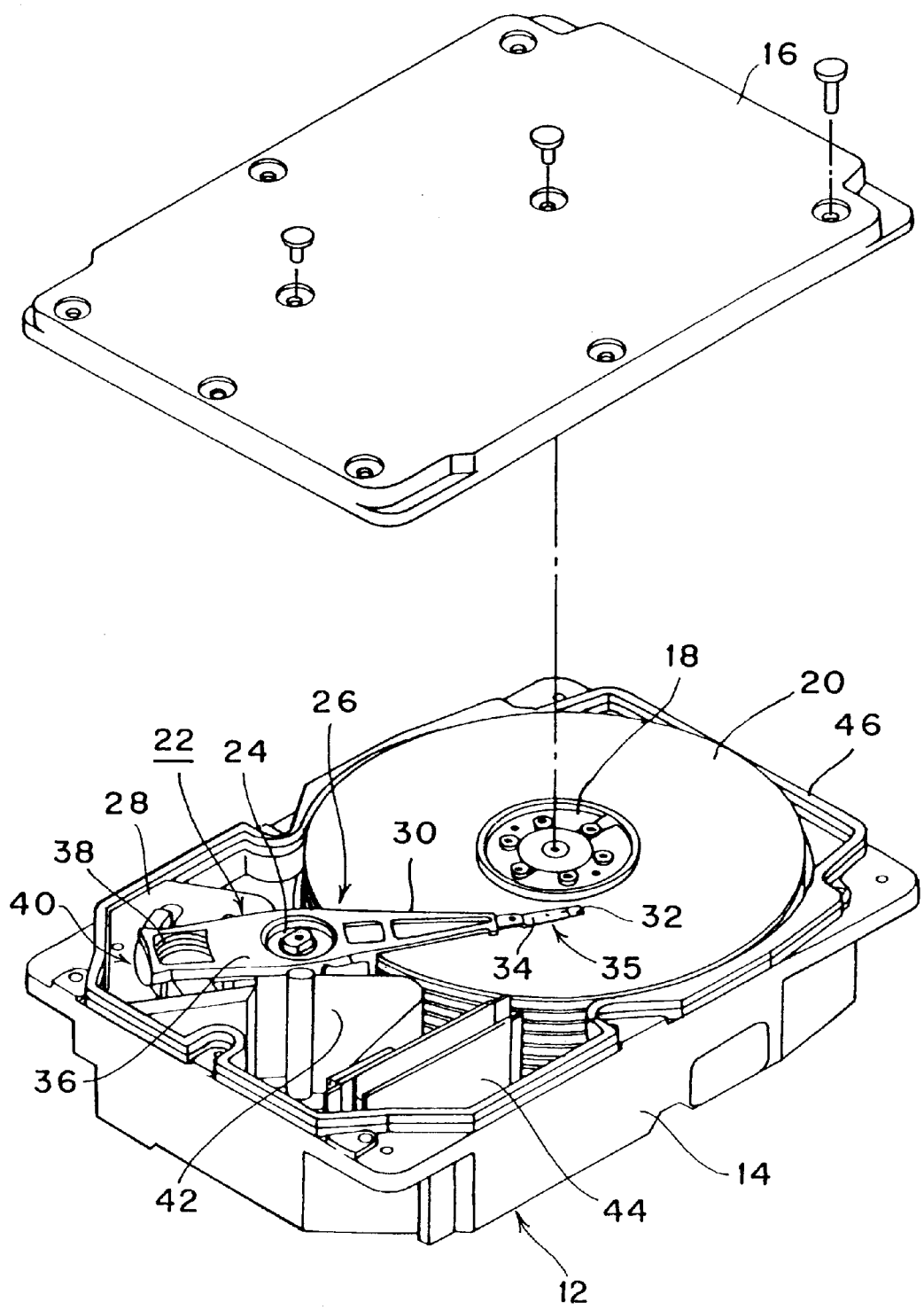
FIG. 1 is a perspective view of a magnetic disk drive including an actuator assembly according to the present invention.

Referring to FIG. 1, there is shown a perspective view of a magnetic disk drive in which an actuator assembly according to the present invention is mounted. Reference numeral 12 denotes a housing (disk enclosure) consisting of a base 14 and a cover 16. A spindle hub (not shown) rotatably driven by an inner hub motor is provided on the base 14. A plurality of magnetic disks 20 and spacers (not shown) are mounted on the spindle hub in such a manner as to be alternately stacked. That is, the plural magnetic disks 20 are fixedly mounted on the spindle hub by securing a disk clamp 18 to the spindle hub by screws, and are equally spaced a given distance by the spacers.

Figure 2:
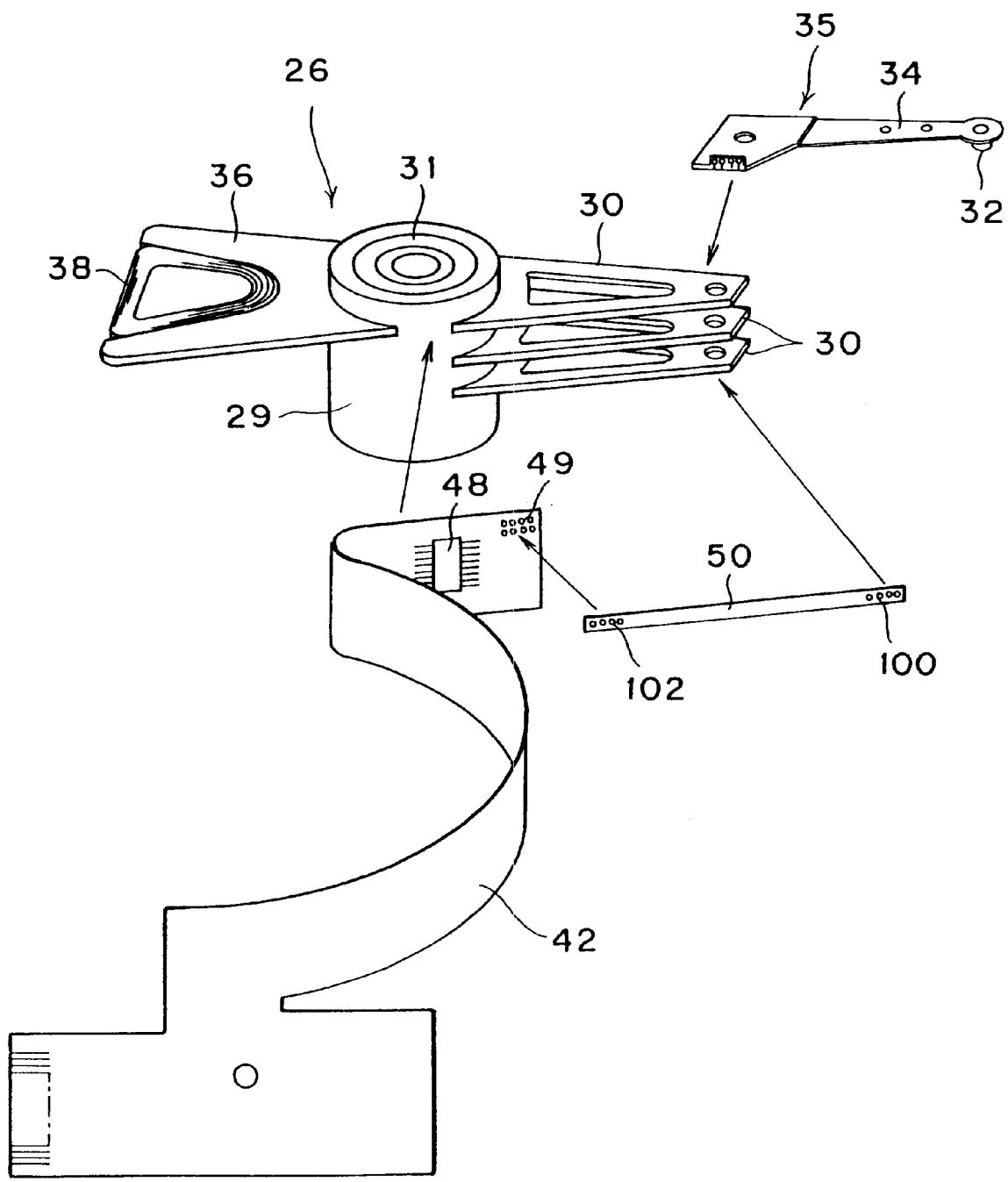
FIG. 2 is an exploded perspective view of the actuator assembly shown in FIG. 1.

Reference numeral 22 denotes a rotary actuator consisting of an actuator assembly 26 and a magnetic circuit 28. The actuator assembly 26 is mounted so as to be rotatable about a shaft 24 fixed to the base 14. As best shown in FIG. 2, the actuator assembly 26 includes an actuator block 29 rotatably mounted on the shaft 24 through a bearing 31, a plurality of actuator arms 30 integral with the actuator block 29 and extending radially therefrom in one direction, and a coil supporting member 36 integral with the actuator block 29 and extending radially therefrom in a direction opposite to the direction of extension of the actuator arms 30.

A suspension 34 is fixed at its base end portion to a front end portion of each actuator arm 30. A magnetic head slider 32 is supported to a front end portion of the suspension 34. The head slider 32 and the suspension 34 constitute a head assembly 35. A coil 38 is supported by the coil supporting member 36. The magnetic circuit 28 and the coil 38 inserted in a gap of the magnetic circuit 28 constitute a voice coil motor (VCM) 40.

Reference numeral 42 denotes a main flexible printed circuit board (main FPC) for taking a signal from an MR element mounted on the head slider 32. The main FPC 42 has a read/write amplifier 48, passive electronic components (not shown), etc. The main FPC 42 further has a plurality of conductive pads (footprints) 49. The main FPC 42 is fixed at its one end to the side surface of the actuator block 29. As shown in FIG. 1, the other end of the main FPC 42 is fixed by a fixing member 44 and electrically connected to a connector (not shown).

Reference numeral 50 denotes an interconnection flexible printed circuit board (interconnection FPC). The interconnection FPC 50 is formed at its opposite ends with a plurality of conductive pads (footprints) 100 and 102. The interconnection FPC 50 is attached to the side surface of each actuator arm 30, so as to interconnect a wiring pattern formed on the suspension 34 and a wiring pattern formed on the main FPC 42. Referring again to FIG. 1, an annular packing assembly 46 is mounted on the base 14. The housing 12 is sealed by securing the cover 16 through the packing assembly 46 to the base 14 by screws.

Figure 3:
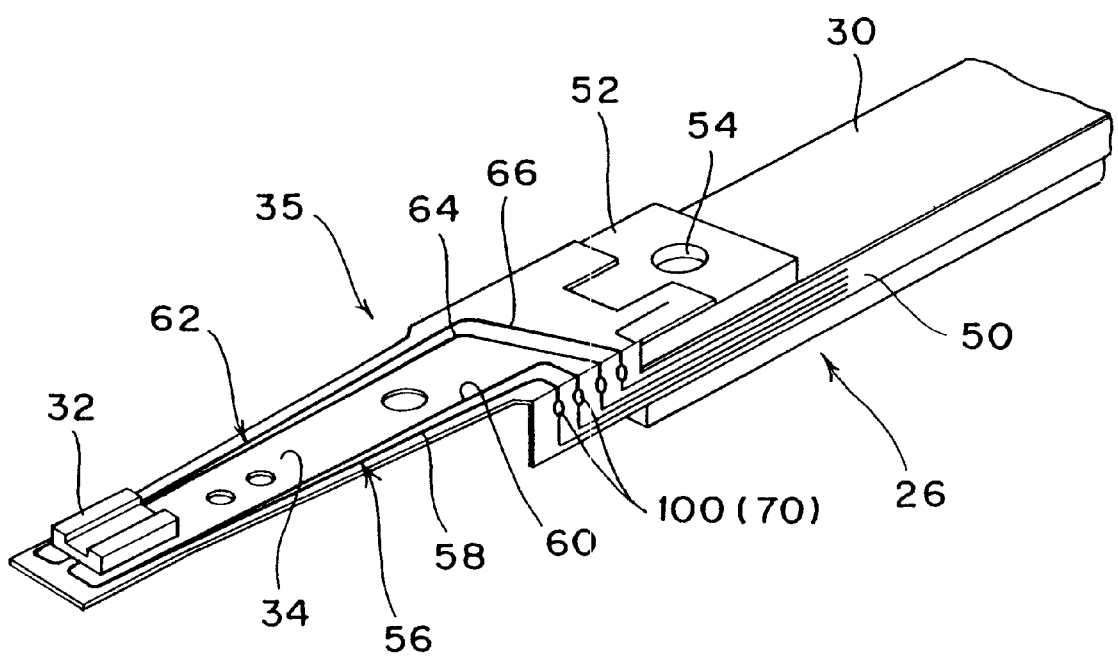
FIG. 3 is a perspective view of an essential part of the actuator assembly.

Referring to FIG. 3, there is shown a perspective view of an essential part of the actuator assembly 26 according to a first preferred embodiment of the present invention. The head slider 32 is mounted on the suspension 34 at its front end portion. The suspension 34 is formed of stainless steel, for example. The head slider 32 has an MR head 32a shown in detail in FIG. 5. The suspension 34 is spot-welded at its base end portion to a spacer 52 formed of stainless steel. The spacer 52 has a cylindrical hole 54 for crimping. By passing a crimping ball (not shown) through the hole 54 of the spacer 52, the head assembly 35 is fixed by crimping to a front end portion of the actuator arm 30.

An MR wiring pattern 56 consisting of a pair of lead lines 58 and 60 and a coil wiring pattern 62 consisting of a pair of lead lines 64 and 66 are formed by printing on the suspension 34. Each of the lead lines 58, 60, 64, and 66 is formed of copper, for example. First ends of the lead lines 58 and 60 are respectively connected to terminals of an MR element embedded in the head slider 32, and first ends of the lead lines 64 and 66 are respectively connected to terminals of a coil embedded in the head slider 32.

Figure 4:
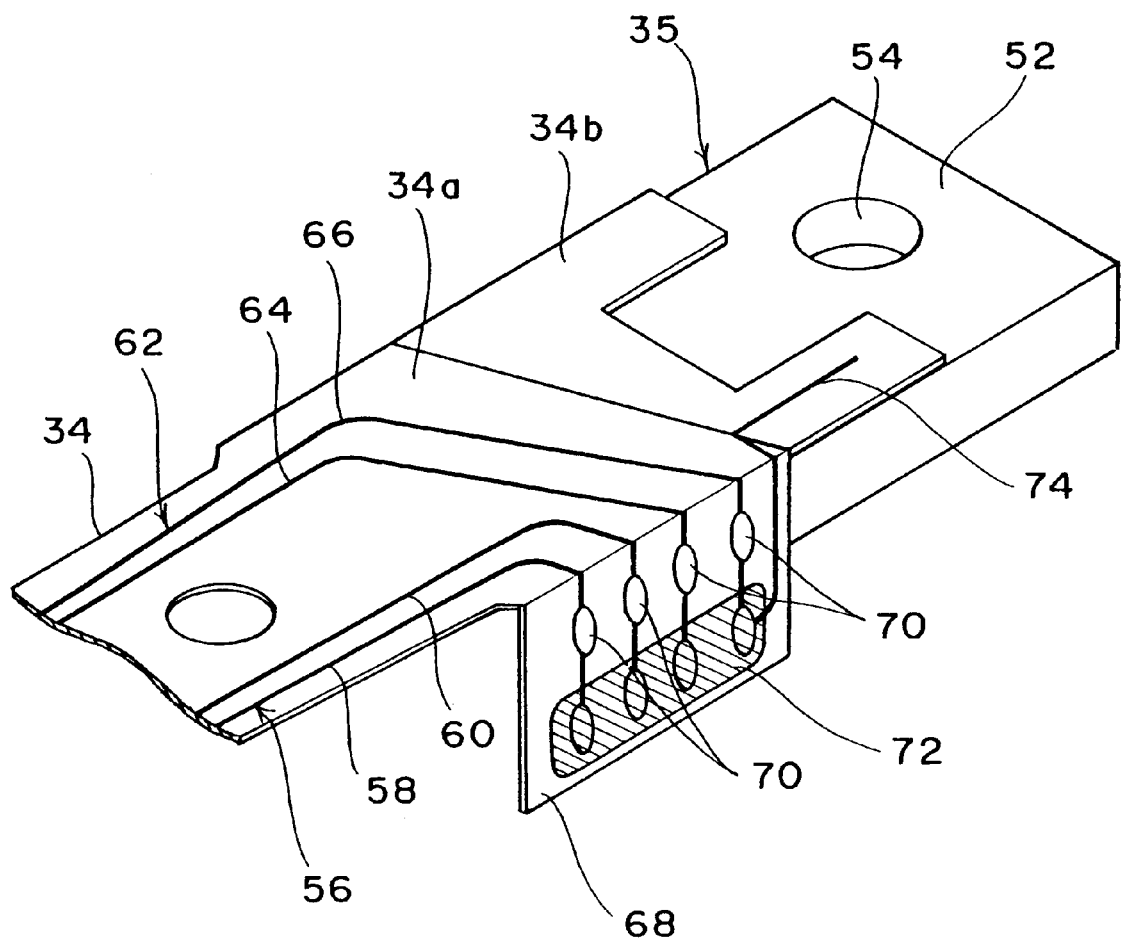
FIG. 4 is an enlarged view of a base end portion of a head assembly according to a first preferred embodiment of the present invention.

As shown in FIG. 4 which is an enlarged view of a base end portion of the head assembly 35, an insulated tab 68 is suspended from one side surface of the suspension 34 at its base end portion. Second ends of the lead lines 58, 60, 64, and 66 extend to the insulated tab 68, and are respectively connected to a plurality of conductive pads (footprints) 70 formed on the insulated tab 68. The lead lines 58, 60, 64, and 66 are short-circuited by a short-circuit pattern 72 formed on the tab 68. The short-circuit pattern 72 is formed of an easily removable material such as a low-melting point solder or a low-melting point alloy.

As shown in FIG. 4, the suspension 34 includes a region 34a covered with an insulating film and a region 34b where the stainless steel is exposed. The lead lines 58, 60, 64, and 66 are formed on the insulating film. A conductive line 74 extends from the short-circuit pattern 72 to the exposed region 34b. Since the suspension 34 is spot-welded to the spacer 52, the short-circuit pattern 72 is electrically connected through the conductive line 74 to the spacer 52. Accordingly, when the head assembly 35 is fixed by crimping to the front end portion of the actuator arm 30, the short-circuit pattern 72 is grounded through the actuator arm 30.

Figure 5:
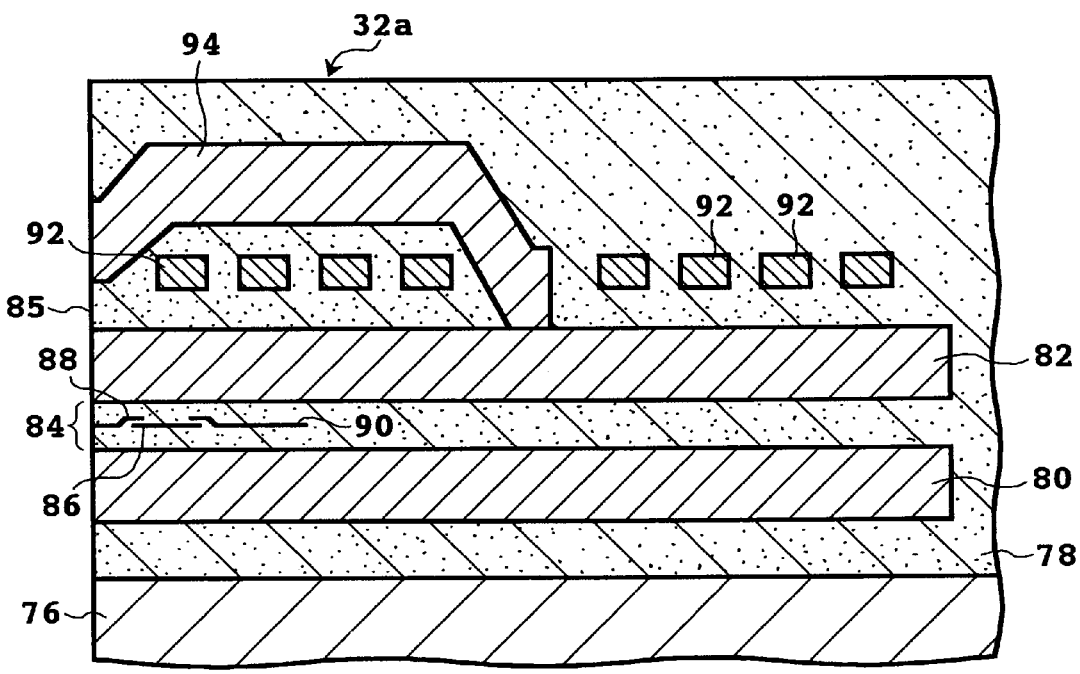
FIG. 5 is a fragmentary sectional view of an MR head.

Referring to FIG. 5, there is shown a fragmentary sectional view of the MR head 32a. The MR head 32a has a conductive substrate 76 and a nonmagnetic insulating layer 78 formed on the conductive substrate 76. The nonmagnetic insulating layer 78 is formed of alumina ($Al_2O_3$), for example. First and second magnetic shields 80 and 82 of nickel-iron (Ni-Fe), for example, are embedded in the nonmagnetic insulating layer 78. A gap 84 for improving a reproductive resolution is defined between the first and second magnetic shields 80 and 82 on a front end surface (medium opposing surface) 85 of the head 32a.

A magnetoresistive element (MR element) 86 of nickel-iron (Ni-Fe), for example, is embedded in the nonmagnetic insulating layer 78 in spaced relationship with the front end surface 85 of the head 32a. A front flux guide 88 of nickel-iron (Ni-Fe), for example, is also embedded in the nonmagnetic insulating layer 78 in such a manner that one end of the front flux guide 88 is exposed to the front end surface 85 of the head 32a and the other end is magnetically coupled to one end of the MR element 86. The front flux guide 88 functions to guide a magnetic flux from the recording medium (magnetic disk) 20 to the MR element 86.

Reference numeral 90 denotes a rear flux guide, which is formed of nickel-iron (Ni-Fe), for example, like the front flux guide 88. One end of the rear flux guide 90 is magnetically coupled to the other end of the MR element 86. Although not especially shown, a sense current source is connected to a pair of terminals of the MR element 86, and a constant sense current is supplied from the sense current source to the MR element 86.

Reference numeral 94 denotes a magnetic pole having one end exposed to the front end surface 85 of the head 32a and the other end connected to the second magnetic shield 82. A conductor coil 92 is wound substantially around a connected portion between the magnetic pole 94 and the second magnetic shield 82. By passing a current modulated by information to be recorded through the coil 92, a magnetic field corresponding to the amperage of the current is induced to thereby magnetically record the information on a recording track of the magnetic disk 20.

In reading information recorded on the magnetic disk 20, the MR element 86 is used. That is, a signal flux from a recording track of the magnetic disk 20 is received into the head 32a and guided by the front flux guide 88 to enter the MR element 86, thereby magnetizing the MR element 86. The magnetic flux passed through the MR element 86 is absorbed by the first and second magnetic shields 80 and 82 through the rear flux guide 90. The resistance of the MR element 86 changes with changes in magnitude of the signal flux. Since a constant sense current is being supplied from the sense current source to the MR element 86, a voltage between the pair of terminals of the MR element 86 changes with changes in the resistance of the MR element 86. Thus, the information recorded on the magnetic disk 20 can be reproduced as a voltage signal.

Figure 6:
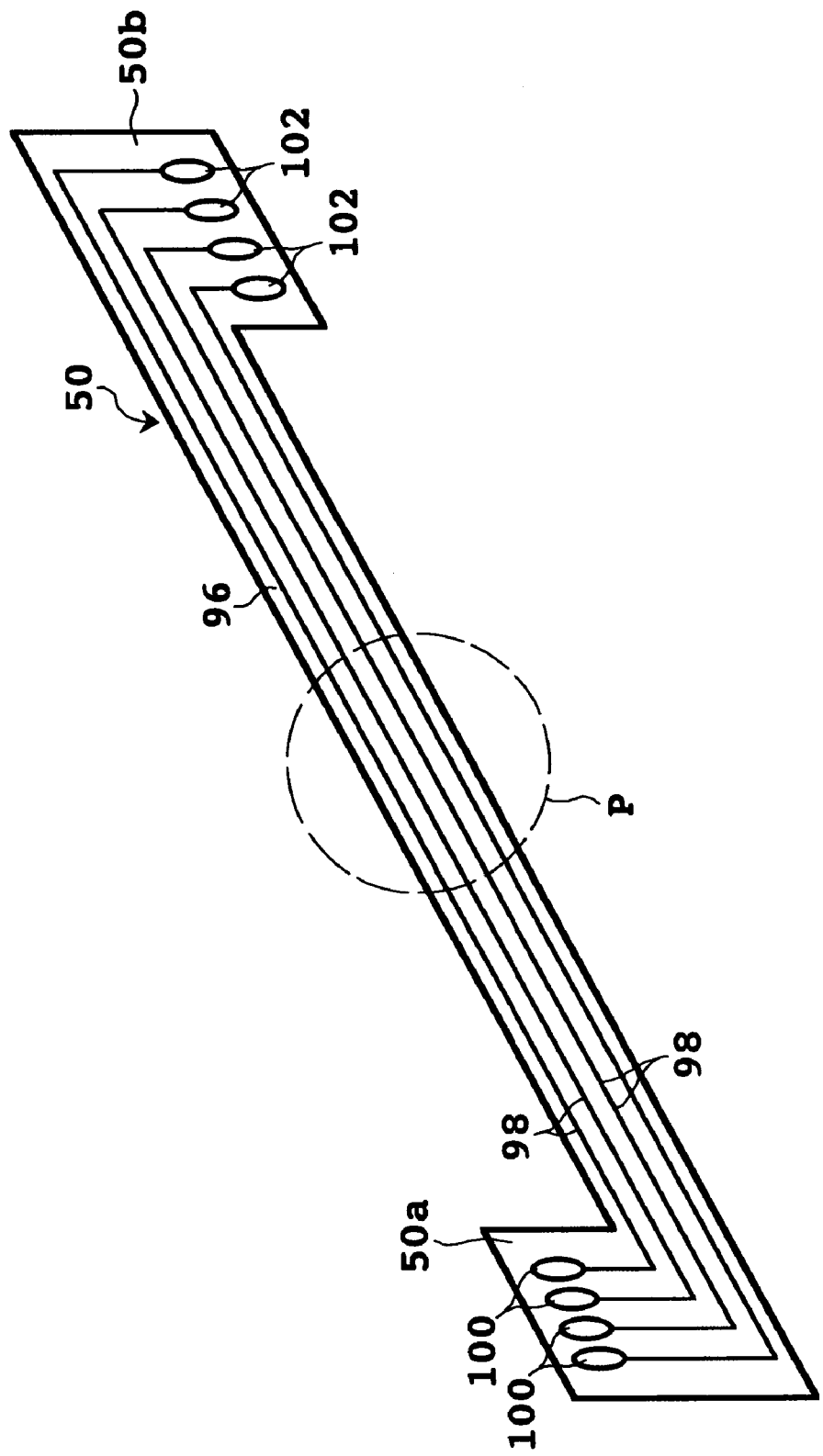
FIG. 6 is a perspective view of an interconnection FPC.
Figure 7:
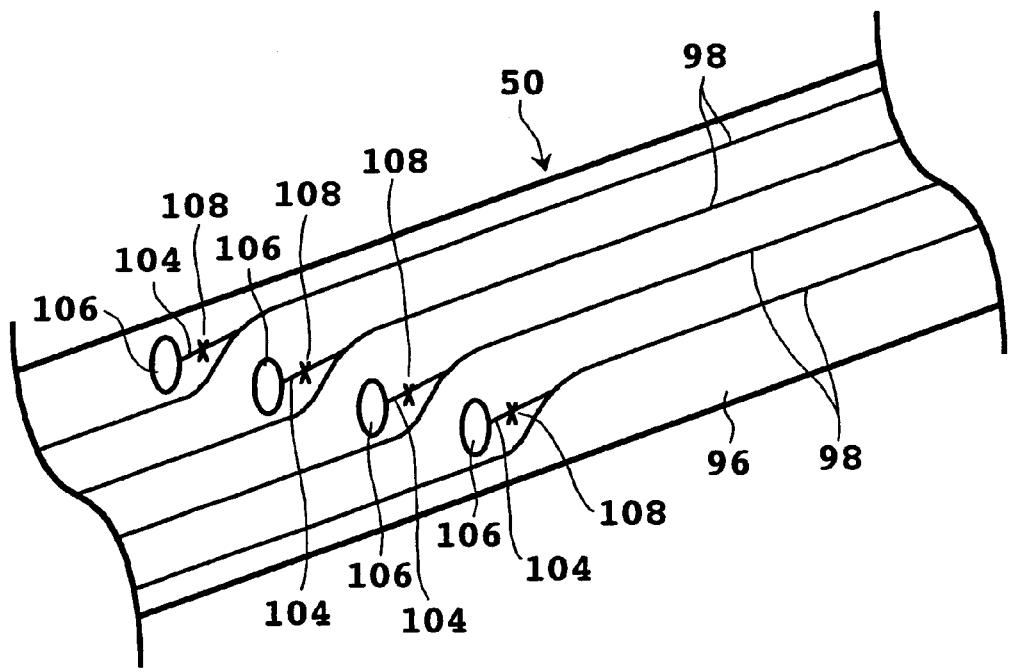
FIG. 7 is an enlarged view of an encircled portion P in FIG. 6.
Figure 8:
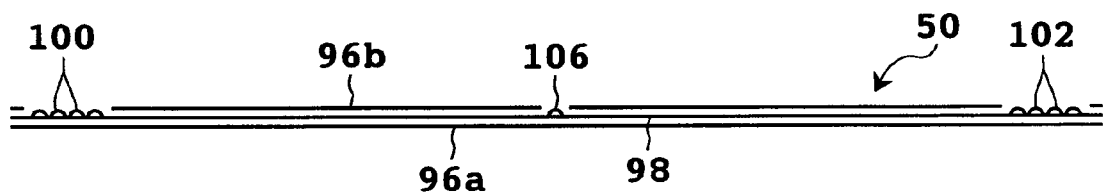
FIG. 8 is a schematic sectional view of the interconnection FPC shown in FIG. 6.

Referring again to FIG. 3, the interconnection FPC 50 is bonded to the side surface of the actuator arm 30. As shown in FIG. 6, the interconnection FPC 50 is composed generally of an insulating film 96 and four lead lines 98 embedded in the insulating film 96. The interconnection FPC 50 has opposite end portions 50a and 50b, and a plurality of conductive pads (footprints) 100 and 102 are formed at the opposite end portions 50a and 50b, respectively. The opposite ends of each lead line 98 are connected to the corresponding conductive pads 100 and 102. Referring to FIG. 7, there is shown an enlarged view of an encircled portion P in FIG. 6. As shown in FIG. 7, each lead line 98 is connected at its middle portion to a ground line 104 terminated by a conductive pad 106. FIG. 8 shows a schematic sectional view of the interconnection FPC 50. As apparent from FIG. 8, each lead line 98 is sandwiched by a pair of insulating film members 96a and 96b constituting the insulating film 96, and the conductive pads 100 and 102 connected to the opposite ends of each lead line 98 are exposed at the opposite end portions 50a and 50b of the interconnection FPC 50. Further, the conductive pad 106 connected to each lead line 98 is exposed at the middle portion of the interconnection FPC 50.

In handling the head assembly 35 shown in FIG. 4 as a separate member, a current caused by static electricity or the like flows in the short-circuit pattern 72, and this current is prevented from flowing into the MR element 86, because the lead lines 58 and 60 connected to the MR element 86 are short-circuited by the short-circuit pattern 72. Accordingly, burning of the MR element 86 due to the current caused by static electricity can be prevented.

A fabrication process for the actuator assembly according to this preferred embodiment will now be described. As shown in FIG. 2, one end portion of the main FPC 42 is first bonded to the actuator block 29, and the coil 38 is mounted to the coil supporting member 36. Then, the head assembly 35 is fixed by crimping to the front end portion of each actuator arm 30. In this condition, the MR element 86 is grounded through the short-circuit pattern 72, the conductive line 74, and the actuator arm 30.

Then, an antistatic film (film+evaporated aluminum+film) is used to cover the conductive pads 70 of the suspension 34 as a soldering portion. Then, the interconnection FPC 50 is bonded to the side surface of the actuator arm 30 by using a double-sided adhesive tape. In the condition where the interconnection FPC 50 is bonded to the side surface of the actuator arm 30, the conductive pads 106 of the interconnection FPC 50 are in contact with the side surface of the actuator arm 30. Accordingly, the lead lines 98 of the interconnection FPC 50 are grounded through the ground lines 104, the conductive pads 106, and the actuator arm 30.

Then, the conductive pads 102 of the interconnection FPC 50 and the conductive pads 49 of the main FPC 42 are connected by bonding. The bonding is carried out by applying a soldering iron to the interconnection FPC 50 to solder the pads 102 and 49 together as heating the film of the interconnection FPC 50. Then, the antistatic film covering the conductive pads 70 of the suspension 34 is removed, and thereafter the conductive pads 100 of the interconnection FPC 50 and the conductive pads 70 of the suspension 34 are connected by bonding. At this time, the short-circuit pattern 72 is fused away by the soldering iron. Accordingly, the terminals of the MR element 86 are opened, and the terminals of the coil 92 are also opened.

Then, as shown by reference numerals 108 in FIG. 7, the ground lines 104 are cut. Accordingly, the MR element 86 and the coil 92 are electrically connected through the lead lines 58, 60, 64, and 66 of the suspension 34 and the lead lines 98 of the interconnection FPC 50 to the read/write amplifier 48 mounted on the main FPC 42. Thereafter, the actuator assembly thus fabricated is subjected to an operation check test.

According to this preferred embodiment, in handling the head assembly 35 as a separate member, breakdown of the MR element 86 due to a current caused by static electricity can be prevented because the terminals of the MR element 86 are short-circuited by the short-circuit pattern 72 as mentioned above. Also after fabricating the actuator assembly 26 as shown in FIG. 2 and in the condition where the short-circuit pattern 72 is not yet removed and the ground lines 104 are not yet cut, breakdown of the MR element 86 due to a current caused by static electricity can be effectively prevented because the terminals of the MR element 86 are electrically grounded. In actually using the actuator assembly 26 in the magnetic disk drive, it is needless to say that the short-circuit pattern 72 is removed and all the ground lines 104 are cut.

Figure 9:
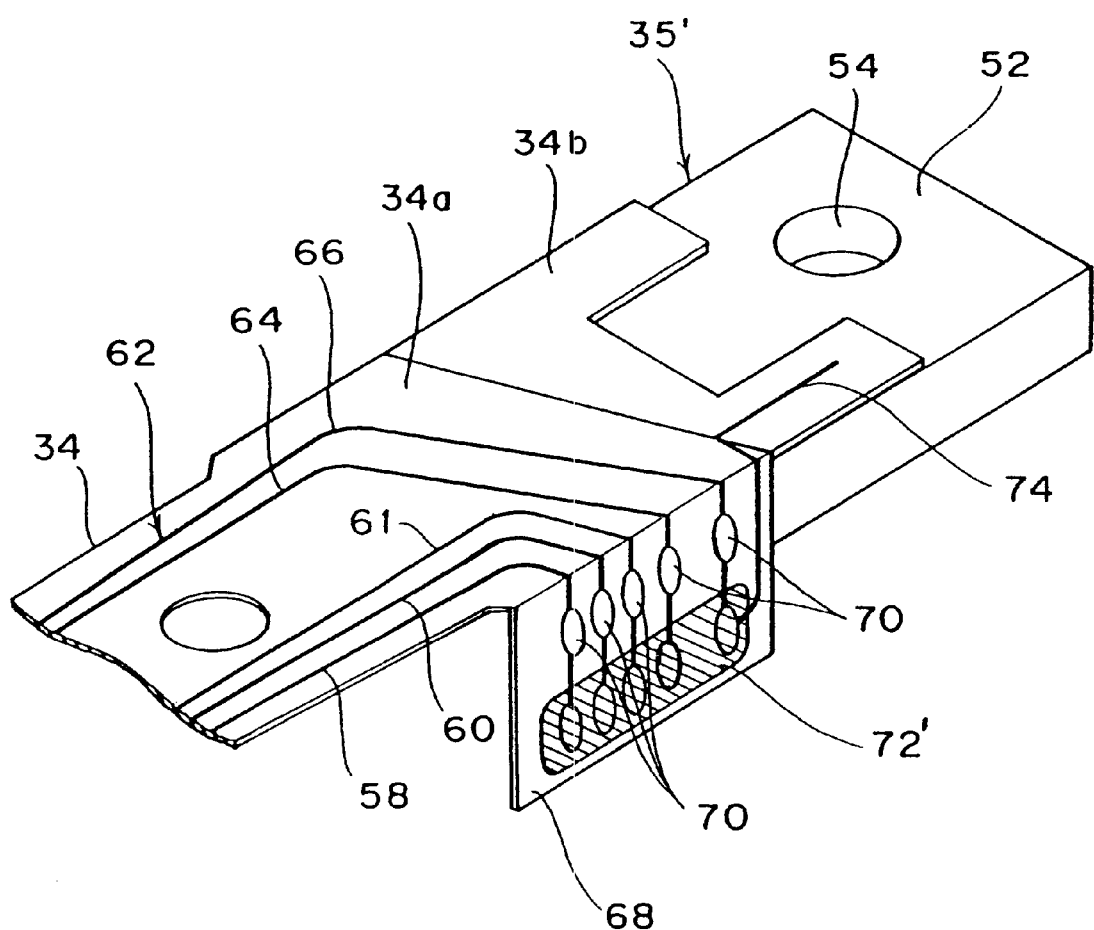
FIG. 9 is a perspective view of an essential part of a head assembly according to a second preferred embodiment of the present invention.

Referring to FIG. 9, there is shown an essential part of a head assembly 35' according to a second preferred embodiment of the present invention. In this preferred embodiment, a ground line 61 for grounding the first and second magnetic shields 80 and 82 (see FIG. 5) is additionally formed on the suspension 34. Like the first preferred embodiment, lead lines 58, 60, 64, and 66 are formed on the suspension 34. The lead lines 58, 60, 64, and 66 and the ground line 61 are connected together by a short-circuit pattern 72' formed of an easily removable material.

In the head assembly 35' of this preferred embodiment, a current caused by static electricity or the like flows in the short-circuit pattern 72'. As a result, in handling the head assembly 35' as a separate member, the current caused by static electricity or the like is prevented from flowing into the MR element 86. Furthermore, discharge between the MR element 86 and the magnetic shields 80 and 82 can also be prevented to thereby prevent breakdown of the MR element 86. In using the head assembly 35' of this preferred embodiment, the interconnection FPC 50 shown in FIG. 6 must be replaced by an interconnection FPC having five lead lines.

As described above, according to the present invention, until the fabrication of the actuator assembly is completed, the terminals of the MR element and the terminals of the coil in the MR head are short-circuited and connected to the ground. Accordingly, even when an excess current due to static electricity is applied between the terminals of the MR element, this current flows in the short-circuit pattern. Further, since the MR element and the magnetic shields are connected through the short-circuit pattern to the ground, discharge of static electricity between the MR element and the magnetic shields can be prevented. As a result, breakdown of the MR element due to static electricity can be effectively prevented.

What is claimed is:

1. An actuator assembly for a magnetic disk drive, comprising:
    an actuator arm adapted to be rotatably mounted in said magnetic disk drive;
    a suspension fixed at a base end portion thereof to a front end portion of said actuator arm;
    a head slider mounted on a front end portion of said suspension and having a magnetoresistive element;
    a pair of first lead lines formed on said suspension, each of said first lead lines having one end connected to said magnetoresistive element;
    a short-circuit pattern formed on said suspension to connect said first lead lines with each other;
    a main flexible printed circuit board fixed at one end portion thereof to said actuator arm and having a read/write circuit;
    an interconnection flexible printed circuit board mounted on said actuator arm and having a plurality of second lead lines for connecting said first lead lines to said read/write circuit; and
    a plurality of first ground lines formed on said interconnection flexible printed circuit board to electrically connect said second lead lines to said actuator arm.

2. An actuator assembly according to claim 1, wherein said short-circuit pattern is fused and each of said first ground lines is cut.

3. An actuator assembly according to claim 1, wherein said short-circuit pattern is formed of an easily removable material selected from a low-melting point solder and a low-melting point alloy.

4. An actuator assembly according to claim 1, further comprising a plurality of conductive pads formed on said interconnection flexible printed circuit board and respectively connected to said first ground lines, said conductive pads being in contact with said actuator arm.

5. An actuator assembly according to claim 1, wherein:
    said head slider further has a magnetic shield for shielding said magnetoresistive element;
    said suspension has a second ground line having one end connected to said magnetic shield; and
    said short-circuit pattern connects said first lead lines and said second ground line.

6. An actuator assembly according to claim 5, wherein said short-circuit pattern is fused.

7. An actuator assembly for a magnetic disk drive, comprising:
    an actuator arm adapted to be rotatably mounted in said magnetic disk drive;
    a suspension fixed at a base end portion thereof to a front end portion of said actuator arm;
    a head slider mounted on a front end portion of said suspension and having an electromagnetic transducer;
    a pair of first lead lines formed on said suspension, each of said first lead lines having one end connected to said electromagnetic transducer;
    a short-circuit pattern formed on said suspension to connect said first lead lines with each other;
    a main flexible printed circuit board fixed at one end portion thereof to said actuator arm and having a read/write circuit;
    an interconnection flexible printed circuit board mounted on said actuator arm and having a plurality of second lead lines for connecting said first lead lines to said read/write circuit; and a plurality of ground lines formed on said interconnection flexible printed circuit board to electrically connect said second lead lines to said actuator arm.

8. An actuator assembly according to claim 7, wherein said short-circuit pattern is fused and each of said ground lines is cut.

9. A magnetic disk drive comprising:

a housing;

a magnetic disk rotatably mounted in said housing;

a head slider having a magnetoresistive element for reading data from said magnetic disk; and an actuator for moving said head slider across tracks of said magnetic disk;

said actuator comprising:

an actuator arm rotatably mounted in said housing;

a suspension having a front end portion supporting said head slider and a base end portion fixed to a front end portion of said actuator arm, said suspension including a pair of first lead lines each of which has one end connected to said magnetoresistive element;

a main flexible printed circuit board fixed at one end portion thereof to said actuator arm and having a read/write circuit; and an interconnection flexible printed circuit board mounted on said actuator arm and having a plurality of second lead lines for connecting said first lead lines to said read/write circuit;

said interconnection flexible printed circuit board having a plurality of ground lines respectively electrically connected to said second lead lines, each of said ground lines being cut in using said actuator in said magnetic disk drive.

* * * * *